United States Patent
Chang et al.

(10) Patent No.: US 10,090,377 B2
(45) Date of Patent: Oct. 2, 2018

(54) SEMICONDUCTOR DEVICE INCLUDING CAPACITOR

(71) Applicant: SAMSUNG ELECTRONICS CO., LTD., Suwon-si, Gyeonggi-do (KR)

(72) Inventors: Jaewan Chang, Seoul (KR); Younsoo Kim, Yongin-si (KR); Sunmin Moon, Yongin-si (KR); Jaehyoung Choi, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/424,951

(22) Filed: Feb. 6, 2017

(65) Prior Publication Data
US 2017/0309701 A1    Oct. 26, 2017

(30) Foreign Application Priority Data

Apr. 26, 2016   (KR) .......................... 10-2016-0051001

(51) Int. Cl.
*H01L 49/02*   (2006.01)
(52) U.S. Cl.
CPC .............. *H01L 28/40* (2013.01); *H01L 28/60* (2013.01); *H01L 28/90* (2013.01)
(58) Field of Classification Search
CPC ............................................. H01L 21/02109
See application file for complete search history.

(56) References Cited

U.S. PATENT DOCUMENTS

| | | | |
|---|---|---|---|
| 7,608,885 | B2 | 10/2009 | Hong et al. |
| 7,723,771 | B2 | 5/2010 | Boescke et al. |
| 7,799,631 | B2 | 9/2010 | Park |
| 7,835,134 | B2 | 11/2010 | Kil et al. |
| 8,084,804 | B2 | 12/2011 | Lee |
| 8,228,730 | B2 | 7/2012 | Sandhu et al. |
| 8,258,064 | B2 | 9/2012 | Lee et al. |
| 8,288,810 | B2 | 10/2012 | Arao |
| 8,722,504 | B2 | 5/2014 | Deweerd et al. |
| 19,059,330 | | 8/2015 | Choi et al. |
| 9,564,217 | B1* | 2/2017 | Zhou .................. G11C 14/0009 |
| 2002/0153579 | A1 | 10/2002 | Yamamoto |
| 2007/0264770 | A1 | 11/2007 | Lee et al. |
| 2011/0006353 | A1 | 1/2011 | Kim et al. |
| 2014/0273512 | A1 | 9/2014 | Kim et al. |

FOREIGN PATENT DOCUMENTS

| | | |
|---|---|---|
| KR | 10-2010-0084677 | 7/2010 |
| KR | 10-2011-0046872 | 5/2011 |
| KR | 10-2013-0037519 | 4/2013 |
| KR | 10-2014-0113095 | 9/2014 |

* cited by examiner

*Primary Examiner* — Cheung Lee
(74) *Attorney, Agent, or Firm* — F. Chau & Associates, LLC

(57) ABSTRACT

A semiconductor device comprises a capacitor that includes a first electrode, a second electrode, and a dielectric layer between the first electrode and the second electrode. The dielectric layer comprises a first high-k dielectric layer between the first electrode and the second electrode, a first silicon oxide layer between the first high-k dielectric layer and the second electrode, and a first aluminum oxide layer between the first high-k dielectric layer and the second electrode.

19 Claims, 10 Drawing Sheets

SEMICONDUCTOR DEVICE INCLUDING CAPACITOR

CROSS-REFERENCE TO RELATED APPLICATIONS

This U.S. nonprovisional patent application claims priority under 35 U.S.C. § 119 from, and the benefit of, Korean Patent Application 10-2016-0051001, filed on Apr. 26, 2016 in the Korean Intellectual Property Office (KIPO), the contents of which are herein incorporated by reference in their entirety.

BACKGROUND

Embodiments of the present inventive concept are directed to a semiconductor device and, more particularly, to a semiconductor device that includes a capacitor.

As semiconductor devices have become more highly integrated, capacitors need to have a high capacitance in a limited area. The capacitance of a capacitor is proportional to a surface area of an electrode and a dielectric constant of a dielectric layer while being inversely proportional to an equivalent oxide thickness of the dielectric layer. Accordingly, to increase the capacitance of a capacitor within a limited area, the surface area of the electrode can be increased. In addition, the capacitance of the capacitor can be increased by reducing the equivalent oxide thickness of the dielectric layer or by using a dielectric layer having a high dielectric constant.

The surface area of the electrode can be increased by increasing the height of a lower electrode or a storage electrode, by increasing an effective surface area of the lower electrode using a hemi-spherical grain (HSG), or by increasing the inner and outer surface areas of a cylinder using a single cylinder storage (OCS) electrode.

SUMMARY

Embodiments of the present inventive concept can provide a semiconductor device that has an enhanced reliability.

According to exemplary embodiments of the present inventive concept, a semiconductor device comprises a capacitor that includes a first electrode, a second electrode, and a dielectric layer between the first electrode and the second electrode. The dielectric layer comprises a first high-k dielectric layer between the first electrode and the second electrode, a first silicon oxide layer between the first high-k dielectric layer and the second electrode; and a first aluminum oxide layer between the first high-k dielectric layer and the second electrode.

According to exemplary embodiments of the present inventive concept, a semiconductor device comprises a capacitor that includes a first electrode, a dielectric layer, and a second electrode that are sequentially stacked on a substrate. The dielectric layer comprises a first high-k dielectric layer on the first electrode; a second high-k dielectric layer on the first high-k dielectric layer; a first leakage prevention oxide layer between the first high-k dielectric layer and the second high-k dielectric layer; and a second leakage prevention oxide layer and a third leakage prevention oxide layer that are sequentially stacked on the second high-k dielectric layer. The first leakage prevention oxide layer may be a silicon oxide layer or an aluminum oxide layer. One of the second and third leakage prevention oxide layers is a silicon oxide layer and the other of the second and third leakage prevention oxide layers is an aluminum oxide layer.

According to exemplary embodiments of the present inventive concept, a semiconductor device comprises an interlayer dielectric layer on a substrate; a plurality of contact plugs that penetrate through the interlayer dielectric layer and is electrically connected to the substrate; and a plurality of capacitors on the interlayer dielectric layer. Each capacitor includes a bottom electrode electrically connected to the substrate via a corresponding contact plug, and a dielectric layer that covers the bottom electrode and that includes a first high-k dielectric layer on the bottom electrode, and a pair of leakage prevention oxide layers that are sequentially stacked on the first high-k dielectric layer. One of the pair of leakage prevention oxide layers is a silicon oxide layer and the other of the pair of leakage prevention oxide layers is an aluminum oxide layer.

DETAILED DESCRIPTION OF EMBODIMENTS

Herein, when one value is described as being about equal to another value, it is to be understood that the values are equal to each other to within a measurement error, or if measurably unequal, are close enough in value to be functionally equal to each other as would be understood by a person having ordinary skill in the art.

Figure 1:
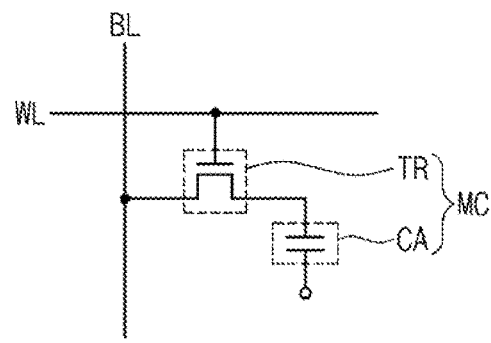
FIG. 1 is a circuit diagram that illustrates a unit memory cell of a semiconductor device according to exemplary embodiments of the present inventive concept.

FIG. 1 is a circuit diagram that illustrates a unit memory cell of a semiconductor device according to exemplary embodiments of the present inventive concept.

Referring to FIG. 1, a memory cell MC according to embodiments electrically connects a word line WL and a bit line BL that cross each other. The memory cell MC includes a transistor TR connected to the word line WL and a capacitor CA connected to the transistor TR. The transistor TR includes a first impurity region connected to the bit line BL and a second impurity region connected to the capacitor CA. The transistor TR can be configured to control a charge flow into the capacitor CA. The memory cell MC stores data of "0" or "1" depending on whether or not the capacitor CA stores a charge.

Hereinafter, a capacitor CA included in a semiconductor device according to exemplary embodiments of the present inventive concept will be described.

Figure 2:
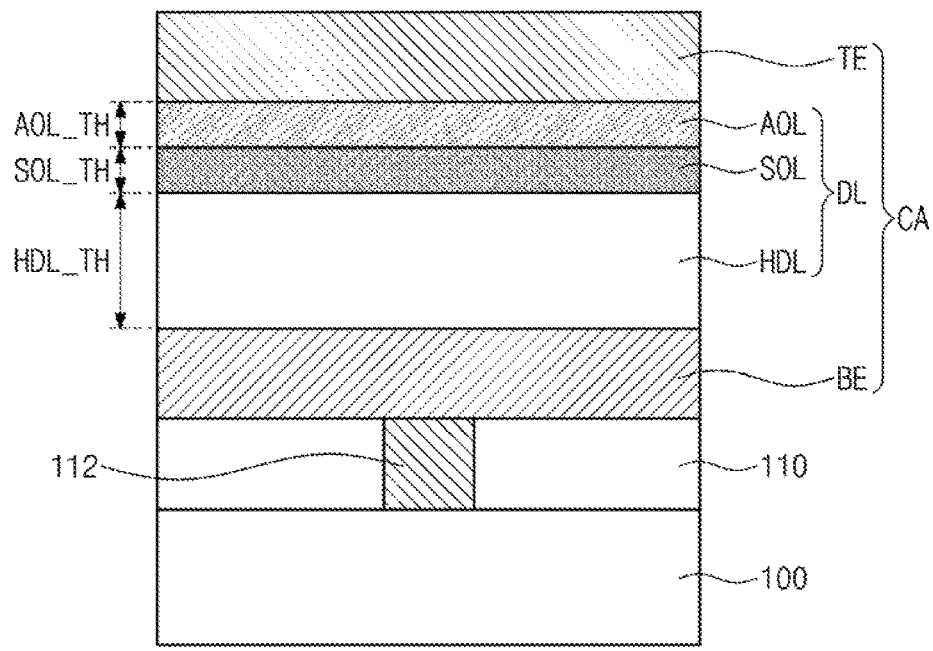
FIGS. 2 and 3 are cross-sectional views of a semiconductor device according to exemplary embodiments of the present inventive concept.
Figure 3:
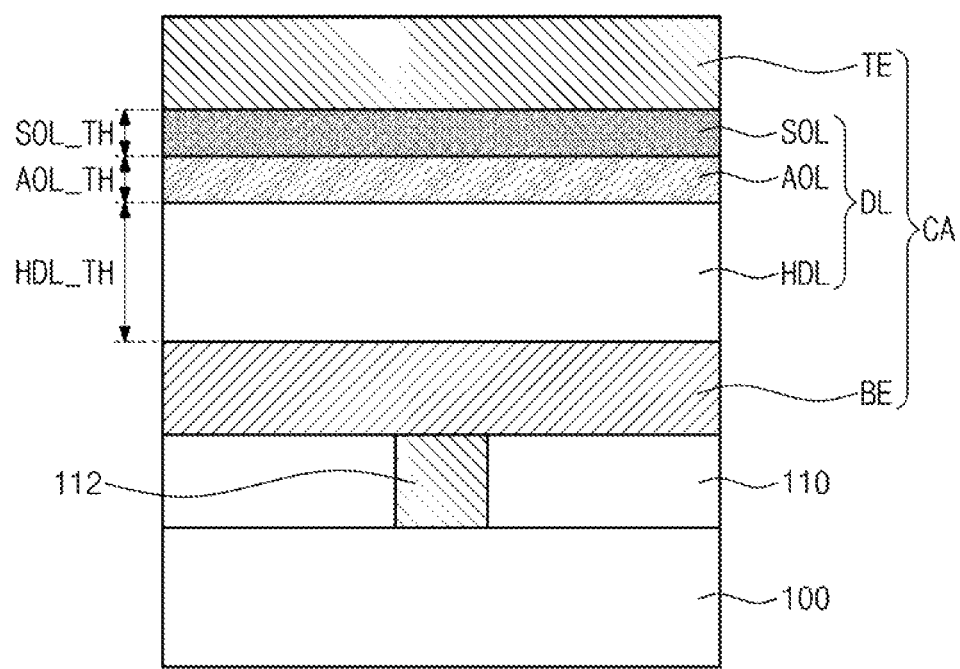

FIGS. 2 and 3 are cross-sectional views of a semiconductor device according to exemplary embodiments of the present inventive concept.

Referring to FIGS. 2 and 3, according to embodiments, an interlayer dielectric layer 110 is provided on a substrate 100. The substrate 100 is a semiconductor substrate. For example, the substrate 100 may be a silicon substrate, a germanium substrate, or a silicon-germanium substrate. In some embodiments, the substrate 100 includes, e.g., first and second impurity regions of a transistor, and the interlayer dielectric layer 110 covers the transistor. The interlayer dielectric layer 110 may include silicon oxide, silicon nitride, and/or silicon oxynitride.

According to embodiments, a contact plug 112 is provided in the interlayer dielectric layer 110. The contact plug 112 passes through the interlayer dielectric layer 110 and is electrically connected to the substrate 100. The contact plug 112 is electrically coupled to one terminal, such as the second impurity region, of the transistor. The contact plug 112 includes a conductive material. For example, the contact plug 112 may include an impurity-doped semiconductor, such as doped silicon, doped germanium, doped silicon-germanium, etc., a metal, such as titanium, tantalum, tungsten, etc., a conductive metal nitride, such as titanium nitride, tantalum nitride, etc., or a metal-semiconductor compound, such as metal silicide.

According to embodiments, a bottom electrode BE is provided on the interlayer dielectric layer 110. The bottom electrode BE is electrically connected to the substrate 100 through the contact plug 112. Shapes of the bottom electrode BE will be described below with reference to FIGS. 9A to 9C. The bottom electrode BE may include an impurity-doped silicon, a metal, a conductive metal nitride, or a metal-semiconductor compound.

According to embodiments, a dielectric layer DL is provided on the bottom electrode BE. The dielectric layer DL includes at least one high-k dielectric layer, at least one silicon oxide layer, and at least one aluminum oxide layer.

In some embodiments, as shown in FIG. 2 or 3, the dielectric layer DL includes a high-k dielectric layer HDL, a silicon oxide layer SOL, and an aluminum oxide layer AOL.

According to embodiments, the high-k dielectric layer HDL is provided on the bottom electrode BE. In some embodiments, the high-k dielectric layer HDL is provided directly on the bottom electrode BE. In other words, according to some embodiments, the high-k dielectric layer HDL is in contact with the bottom electrode BE. The high-k dielectric layer HDL has a dielectric constant greater than those of the silicon oxide layer SOL and the aluminum oxide layer AOL. The high-k dielectric layer HDL may include at least one of a $ZrO_2$ layer, a $TiO_2$ layer, a $HfO_2$ layer, a $Ta_2O_5$ layer, a $Nb_2O_5$ layer, a $SrTiO_3$ layer, a $BaTiO_3$ layer, and a $Ba_xSr_{1-x}TiO_3$ (0<x<1) layer. The high-k dielectric layer HDL has a thickness HDL_TI greater than a thickness SOL_TH of the silicon oxide layer SOL and a thickness AOL_TH of the aluminum oxide layer AOL. For example, the thickness HDL_TH of the high-k dielectric layer HDL is in the range from about 20 Å to about 70 Å. The high-k dielectric layer HDL may be formed by, for example, atomic layer deposition (ALD) and has a crystalline state.

According to embodiments, the silicon oxide layer SOL and the aluminum oxide layer AOL are provided on the high-k dielectric layer HDL. In some embodiments, as shown in FIG. 2, the silicon oxide layer SOL is interposed between the high-k dielectric layer HDL and the aluminum oxide layer AOL. In other embodiments, as shown in FIG. 3, the aluminum oxide layer AOL is interposed between the high-k dielectric layer HDL and the silicon oxide layer SOL.

According to embodiments, the silicon oxide layer SOL includes $SiO_2$, and the aluminum oxide layer AOL includes $Al_2O_3$. Each of the silicon oxide layer SOL and the aluminum oxide layer AOL has a band gap greater than that of the high-k dielectric layer HDL, so that it is possible to suppress a leakage current generated from the dielectric layer DL. In some embodiments, the thickness SOL_TH of the silicon oxide layer SOL is about 0.003 to about 0.5 times the thickness HDL_TH of the high-k dielectric layer HDL. For example, the thickness SOL_TH of the silicon oxide layer SOL is in the range from about 0.2 Å to about 10 Å. In some embodiments, the thickness AOL_TH of the aluminum oxide layer AOL is about 0.005 to about 0.5 times the thickness HDL_TH of the high-k dielectric layer HDL. For example, the thickness AOL_TH of the aluminum oxide layer AOL is in the range from about 0.3 Å to about 10 Å. In some embodiments, the thickness SOL_TH of the silicon oxide layer SOL is less than the thickness AOL_TH of the aluminum oxide layer AOL. However, embodiments of the present inventive concept are not limited thereto. The silicon oxide layer SOL and the aluminum oxide layer AOL may be formed by, for example, atomic layer deposition (ALD) and have an amorphous state. In some embodiments, different from those shown in FIGS. 2 and 3, the silicon oxide layer SOL or the aluminum oxide layer AOL partially cover respective underlying layers.

According to embodiments, a top electrode TE is provided on the dielectric layer DL. The top electrode TE may include an impurity-doped silicon, a metal, a conductive metal nitride, or a metal-semiconductor compound. The bottom electrode BE, the dielectric layer DL, and the top electrode TE constitute the capacitor CA described with reference to FIG. 1. The contact plug 112 electrically connects the capacitor CA to one terminal, such as the second impurity region of the transistor formed on the substrate 100.

Figure 4A:
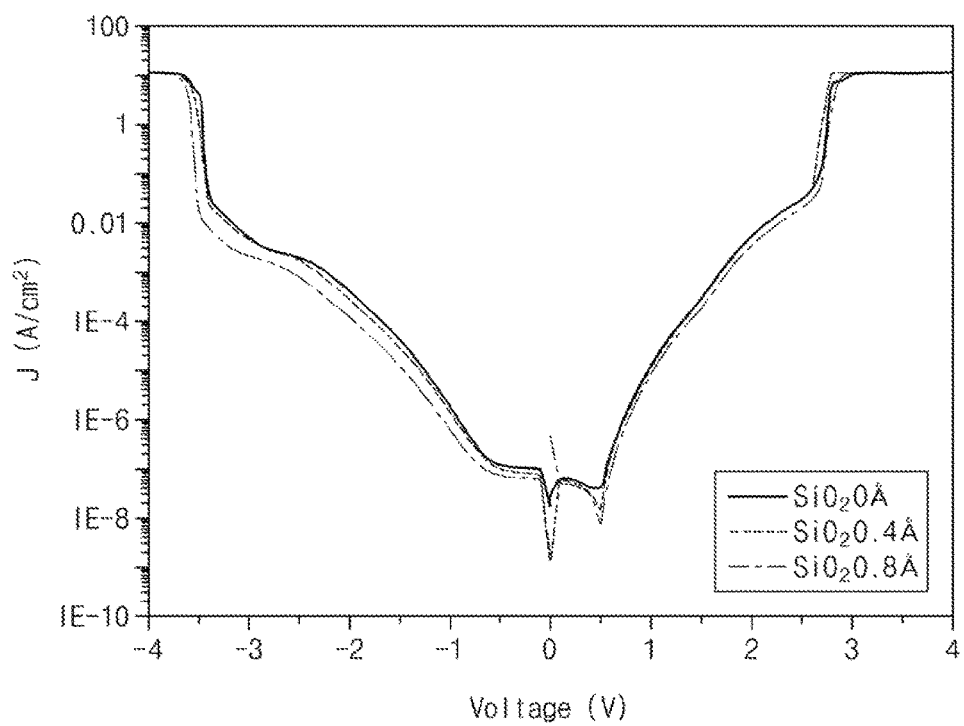
FIG. 4A is a graph that illustrates leakage current characteristics of a capacitor according to exemplary embodiments of the present inventive concept.

FIG. 4A is a graph that illustrates leakage current characteristics of a capacitor according to exemplary embodiments of the present inventive concept.

In detail, FIG. 4A shows a curve of leakage current density, plotted along the vertical axis, versus voltage, plotted along the horizontal axis, based on a thickness of a silicon oxide layer in a capacitor composed of a bottom electrode, a high-k dielectric layer, a silicon oxide layer, an aluminum oxide layer, and a top electrode that are sequentially stacked. The bottom and top electrodes were formed of TiN. A $ZrO_2$ layer of about 40 Å was used as the high-k dielectric layer, and an $Al_2O_3$ of about 5 Å was used as the aluminum oxide layer. $SiO_2$ layers of 0 Å (i.e., no silicon oxide layer), 0.4 Å and 0.8 Å were each used as the silicon oxide layer.

Referring to FIG. 4A, it can be seen that a leakage current density for the same voltage is lower when a silicon oxide layer is provided than when no silicon oxide layer is provided. It can also be seen that a leakage current density for the same voltage is lower when the silicon oxide layer is about 0.8 Å thick than when the silicon oxide layer is about 0.4 Å thick.

In other words, according to exemplary embodiments of the present inventive concept, it is possible to reduce the leakage current of a capacitor by introducing a silicon oxide layer into a dielectric layer that includes a high-k dielectric layer and an aluminum oxide layer.

Figure 4B:
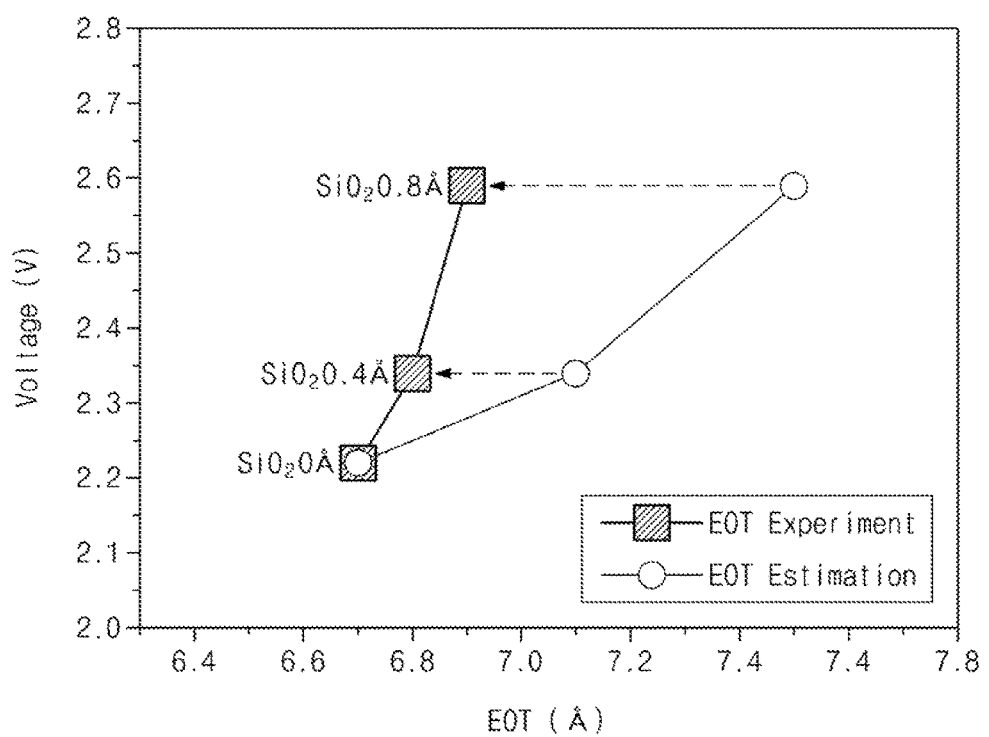
FIG. 4B is a graph that illustrates an equivalent oxide thickness (EOT) of a capacitor according to exemplary embodiments of the present inventive concept.

FIG. 4B is a graph that illustrates an equivalent oxide thickness EOT of a capacitor according to exemplary embodiments of the present inventive concept.

In detail, FIG. 4B shows a negative voltage value, plotted along the vertical axis, that corresponds to a leakage current density of about $10^{-3}$ A/cm$^2$, and estimated and experimental values, plotted along the horizontal axis, of the equivalent oxide thickness of a capacitor composed of a bottom electrode, a high-k dielectric layer, a silicon oxide layer, an aluminum oxide layer, and a top electrode that are sequentially stacked. The capacitor used for the experiment is the same as the capacitor described with reference to FIG. 4A. The estimated equivalent oxide thicknesses of the capacitor, represented by a hollow circle in the figure, were acquired using a definition of equivalent oxide thickness, i.e., the equivalent oxide thickness=(thickness of dielectric layer)×(dielectric constant of SiO$_2$)/(dielectric constant of dielectric layer). The experimental equivalent oxide thicknesses, represented by a solid square in the figure, were acquired by measuring an equivalent oxide thickness of an actual capacitor.

Referring to FIG. 4B, it can be seen that the experimental equivalent oxide thickness is the same as the estimated equivalent oxide thickness when no silicon oxide layer is provided, while the experimental equivalent oxide thickness is less than the estimated equivalent oxide thickness when a silicon oxide layer is provided. It can also be seen that a difference between the estimated and experimental equivalent oxide thicknesses is greater when the silicon oxide layer is about 0.8 Å thick than when the silicon oxide layer is about 0.4 Å thick.

In other words, according to exemplary embodiments of the present inventive concept, it is possible to reduce the leakage current of a capacitor without increasing the equivalent oxide thickness by introducing a silicon oxide layer into a dielectric layer that includes a high-k dielectric layer and an aluminum oxide layer.

Figure 5:
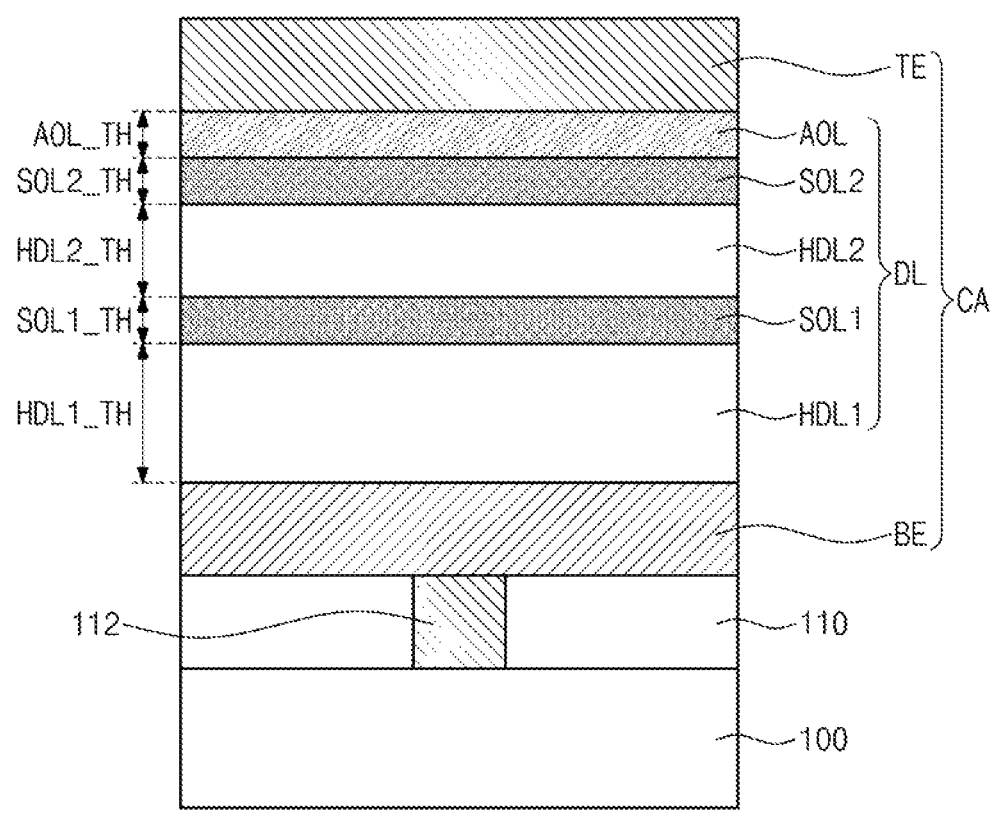
FIGS. 5 and 6 are cross-sectional views of a semiconductor device according to exemplary embodiments of the present inventive concept.
Figure 6:
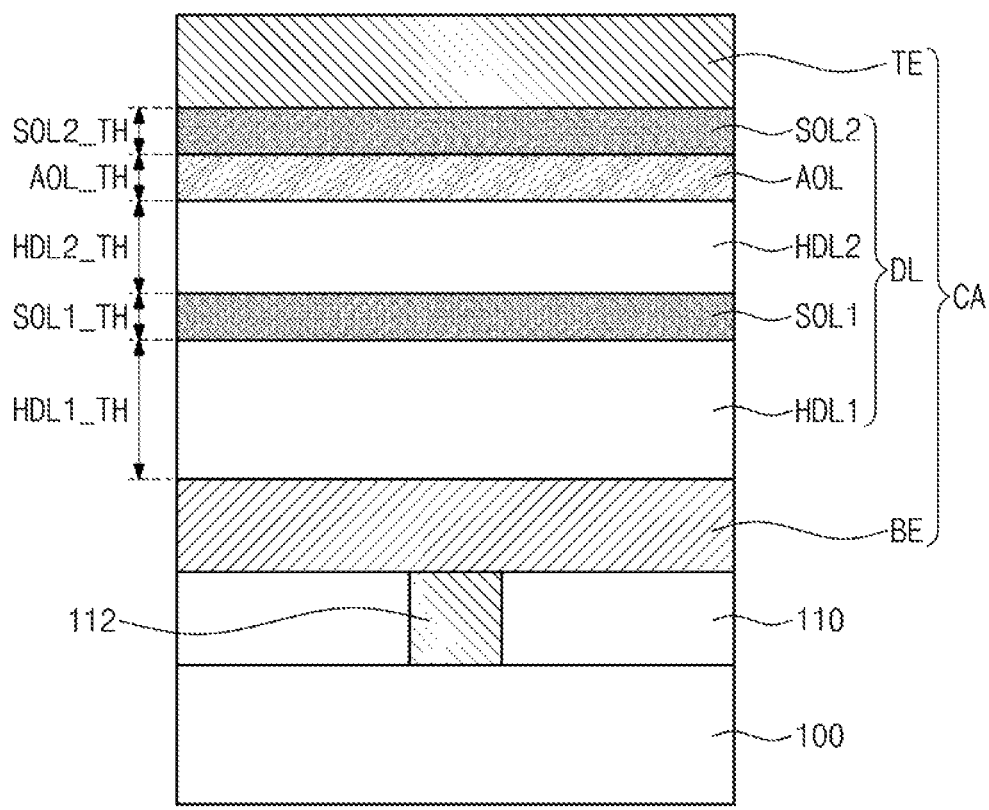

FIGS. 5 and 6 are cross-sectional views of a semiconductor device according to exemplary embodiments of the present inventive concept.

Referring to FIGS. 5 and 6, according to embodiments, a semiconductor device includes a substrate 100, an interlayer dielectric layer 110, a contact plug 112, and a capacitor CA. The capacitor CA includes a bottom electrode BE, a dielectric layer DL, and a top electrode TE that are sequentially stacked.

According to embodiments, the substrate 100, the interlayer dielectric layer 110, the contact plug 112, the bottom electrode BE, and the top electrode TE are substantially the same those described with reference to FIGS. 2 and 3, and detailed descriptions thereof have been omitted.

According to embodiments, the dielectric layer DL is provided between the bottom electrode BE and the top electrode TE. The dielectric layer DL includes at least one high-k dielectric layer, at least one silicon oxide layer, and at least one aluminum oxide layer.

In some embodiments, as shown in FIG. 5 or 6, the dielectric layer DL includes a first high-k dielectric layer HDL1, a second high-k dielectric layer HDL2, a first silicon oxide layer SOL1, a second silicon oxide layer SOL2, and an aluminum oxide layer AOL.

According to embodiments, the first and second high-k dielectric layers HDL1 and HDL2 are provided on the bottom electrode BE. In some embodiments, the first high-k dielectric layer HDL1 is provided directly on the bottom electrode BE. In other words, according to some embodiments, the first high-k dielectric layer HDL1 is in contact with the bottom electrode BE. The second high-k dielectric layer HDL2 is provided on the first high-k dielectric layer HDL1, and the first silicon oxide layer SOL1 is interposed between the first and second high-k dielectric layers HDL1 and HDL2. Each of the first and second high-k dielectric layers HDL1 and HDL2 has a dielectric constant greater than those of the first and second silicon oxide layers SOL1 and SOL2 and the aluminum oxide layer AOL. Each of the first and second high-k dielectric layers HDL1 and HDL2 includes at least one of a ZrO$_2$ layer, a TiO$_2$ layer, a HfO$_2$ layer, a Ta$_2$O$_5$ layer, a Nb$_2$O$_5$ layer, a SrTiO$_3$ layer, a BaTiO$_3$ layer, and a Ba$_x$Sr$_{1-x}$TiO$_3$ (0<x<1) layer. Each of the thicknesses HDL1_TH and HDL2_TH of the first and second high-k dielectric layers HDL1 and HDL2 is greater than thicknesses SOL1_TH and SOL2_TH of the first and second silicon oxide layers SOL1 and SOL2 and a thickness AOL_TH of the aluminum oxide layer AOL. In addition, the thickness HDL1_TH of the first high-k dielectric layer HDL1 is greater than the thickness HDL2_TH of the second high-k dielectric layer HDL2. For example, the thickness HDL1_TH of the first high-k dielectric layer HDL1 is in the range from about 20 Å to about 70 Å, and the thickness HDL2_TH of the second high-k dielectric layer HDL2 is in the range from about 30 Å to about 40 Å. Each of the first and second high-k dielectric layers HDL1 and HDL2 may be formed using, for example, atomic layer deposition (ALD).

In some embodiments, the first high-k dielectric layer HDL1 has a crystalline state, and the second high-k dielectric layer HDL2 may have an amorphous state or a crystalline state with a lower crystallinity than that of the first high-k dielectric layer HDL. The phrase "higher crystallinity" means that a structural arrangement of atoms included in the layer is highly ordered. On the other hand, the phrase "lower crystallinity" means that a structural arrangement of atoms included in the layer is not highly ordered. A crystallinity difference between the first and second high-k dielectric layers HDL1 and HDL2 is due to the first high-k dielectric layer HDL1 being formed on the bottom electrode BE in a crystalline state and the second high-k dielectric layer HDL2 being formed on the first silicon oxide layer SOL1 in an amorphous state. In this case, the first high-k dielectric layer HDL1 has a dielectric constant greater than that of the second high-k dielectric layer HLD2. For example, even if both of the first and second high-k dielectric layers HDL1 and HDL2 are a ZrO$_2$ layer, the first high-k dielectric layer HDL1 has a higher dielectric constant than the second high-k dielectric layer HDL2.

According to embodiments, the first silicon oxide layer SOL1 is interposed between the first and second high-k dielectric layers HDL1 and HDL2. The second silicon oxide layer SOL2 and the aluminum oxide layer AOL is provided on the second high-k dielectric layer HDL2. In some embodiments, as shown in FIG. 5, the second silicon oxide layer SOL2 is interposed between the second high-k dielectric layer HDL2 and the aluminum oxide layer AOL. In other embodiments, as shown in FIG. 6, the aluminum oxide layer AOL is interposed between the second high-k dielectric layer HDL2 and the second silicon oxide layer SOL2.

According to embodiments, the first and second silicon oxide layers SOL1 and SOL2 include SiO$_2$, and the aluminum oxide layer AOL includes Al$_2$O$_3$. Each of the aluminum oxide layer AOL and the first and second silicon oxide layers SOL1 and SOL2 have a band gap greater than those of the first and second high-k dielectric layers HDL1 and HDL2, and thus it is possible to suppress a leakage current generated from the dielectric layer DL. In some embodiments, each of the thicknesses SOL1_TH and SOL2_TH of the first and second silicon oxide layers SOL1 and SOL2 are from about 0.003 to about 0.5 times the thickness HDL1_TH of the first high-k dielectric layer HDL1. For example, each of the thicknesses SOL1_TH and SOL2_TH of the first and second silicon oxide layers SOL1 and SOL2 are in the range from about 0.2 Å to about 10 Å. In some embodiments, the thickness AOL_TH of the aluminum oxide layer AOL is about 0.005 to about 0.5 times the thickness HDL1_TH of the first high-k dielectric layer HDL1. For example, the thickness AOL_TH of the aluminum oxide layer AOL is in the range from about 0.3 Å to about 10 Å. In some embodiments, each of the thicknesses SOL1_TH and SOL2_TH of the first and second silicon oxide layers SOL1 and SOL2 is less than the thickness AOL_TH of the aluminum oxide layer AOL. However, embodiments of the present inventive concept are not limited thereto. The aluminum oxide layer AOL and the first and second silicon oxide layers SOL1 and SOL2 may be formed using, for example, atomic layer deposition (ALD) and have an amorphous state. In some embodiments, different from those shown in FIGS. 5 and 6, the first silicon oxide layer SOL1, the second silicon oxide layer SOL2, or the aluminum oxide layer AOL partially cover respective underlying layers.

As described with reference to FIGS. 4A and 4B, the leakage current of a capacitor can be reduced without increasing the equivalent oxide thickness by introducing a silicon oxide layer into a dielectric layer that includes a high-k dielectric layer and an aluminum oxide layer.

Figure 7:
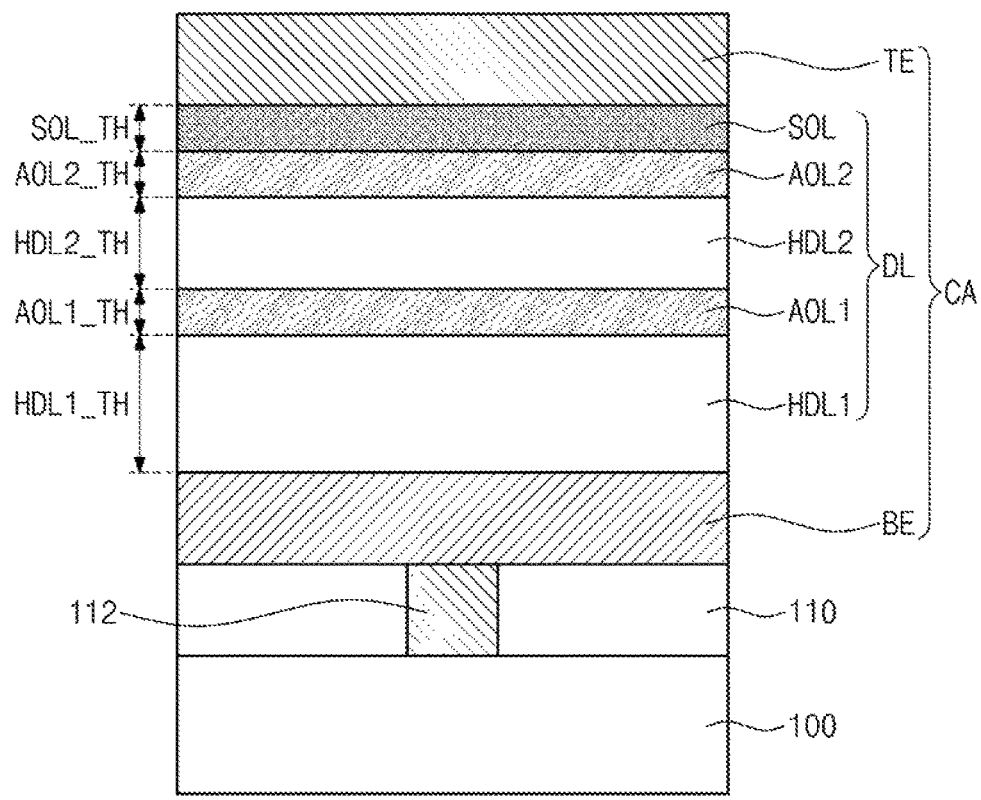
FIGS. 7 and 8 are cross-sectional views of a semiconductor device according to exemplary embodiments of the present inventive concept.
Figure 8:
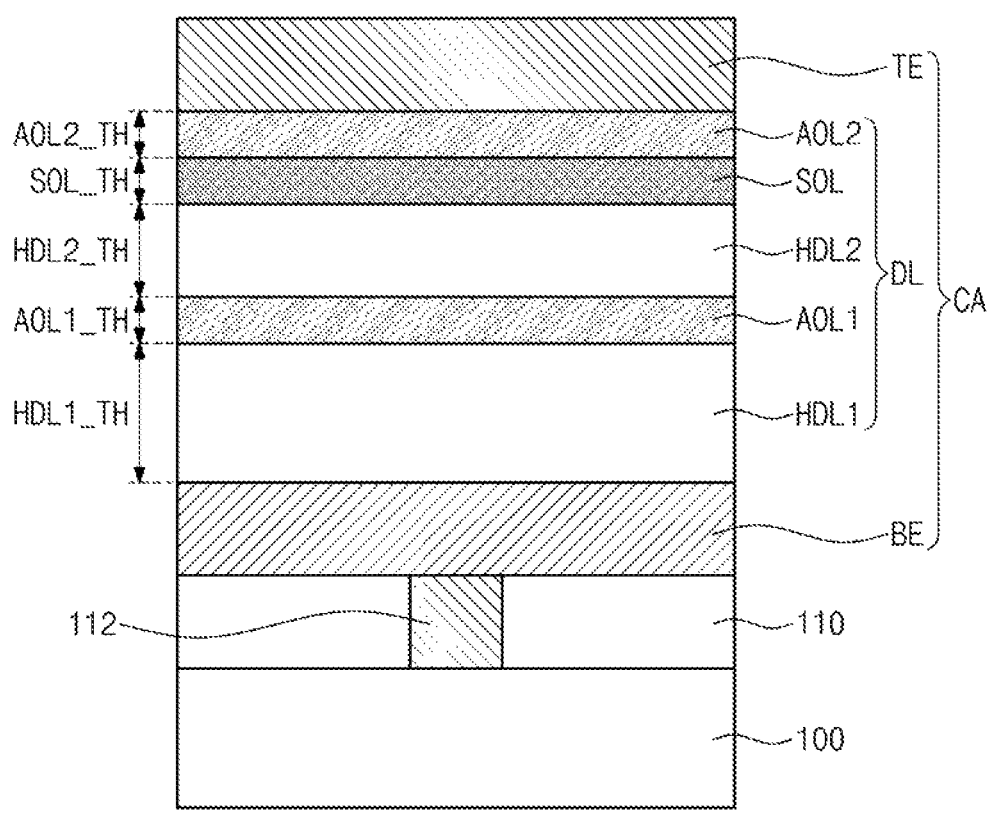

FIGS. 7 and 8 are cross-sectional views of a semiconductor device according to exemplary embodiments of the present inventive concept.

Referring to FIGS. 7 and 8, according to embodiments, a semiconductor device includes a substrate 100, an interlayer dielectric layer 110, a contact plug 112, and a capacitor CA. The capacitor CA includes a bottom electrode BE, a dielectric layer DL, and a top electrode TE that are sequentially stacked.

According to embodiments, the substrate 100, the interlayer dielectric layer 110, the contact plug 112, the bottom electrode BE, and the top electrode TE are substantially the same those described with reference to FIGS. 2 and 3, and detailed descriptions thereof have been omitted.

According to embodiments, the dielectric layer DL is provided between the bottom electrode BE and the top electrode TE. The dielectric layer DL includes at least one high-k dielectric layer, at least one silicon oxide layer, and at least one aluminum oxide layer.

In some embodiments, as shown in FIG. 7 or 8, the dielectric layer DL includes a first high-k dielectric layer HDL1, a second high-k dielectric layer HDL2, a first aluminum oxide layer AOL1, a second aluminum oxide layer AOL2, and a silicon oxide layer SOL.

According to embodiments, the first and second high-k dielectric layers HDL1 and HDL2 are provided on the bottom electrode BE. In some embodiments, the first high-k dielectric layer HDL1 is provided directly on the bottom electrode BE. In other words, according to some embodiments, the first high-k dielectric layer HDL1 is in contact with the bottom electrode BE. The second high-k dielectric layer HDL2 is provided on the first high-k dielectric layer HDL, and the first aluminum oxide layer AOL1 is interposed between the first and second high-k dielectric layers HDL1 and HDL2. Each of the first and second high-k dielectric layers HDL1 and HDL2 has a dielectric constant greater than those of the first and second aluminum oxide layers AOL1 and AOL2 and the silicon oxide layer SOL. Each of the first and second high-k dielectric layers HDL1 and HDL2 may include at least one of a $ZrO_2$ layer, a $TiO_2$ layer, a $HfO_2$ layer, a $Ta_2O_5$ layer, a $Nb_2O_5$ layer, a $SrTiO_3$ layer, a $BaTiO_3$ layer, and a $Ba_xSr_{1-x}TiO_3$ (0<x<1) layer. Each of the thicknesses HDL1_TH and HDL2_TH of the first and second high-k dielectric layers HDL1 and HDL2 is greater than the thicknesses AOL1_TH and AOL2_TH of the first and second aluminum oxide layers AOL1 and AOL2 and a thickness SOL_TH of the silicon oxide layer SOL. In addition, the thickness HDL1_TH of the first high-k dielectric layer HDL1 is greater than the thickness HDL2_TH of the second high-k dielectric layer HDL2. For example, the thickness HDL1_TH of the first high-k dielectric layer HDL1 is in the range from about 20 Å to about 70 Å, and the thickness HDL2_TH of the second high-k dielectric layer HDL2 is in the range from 30 Å to about 40 Å. Each of the first and second high-k dielectric layers HDL1 and HDL2 may be formed using, for example, atomic layer deposition (ALD).

In some embodiments, the first high-k dielectric layer HDL1 has a crystalline state, and the second high-k dielectric layer HDL2 has an amorphous state or a crystalline state with a lower crystallinity than that of the first high-k dielectric layer HDL1. A crystallinity difference between the first and second high-k dielectric layers HDL1 and HDL2 is due to the first high-k dielectric layer HDL1 being formed on the bottom electrode BE in a crystalline state and the second high-k dielectric layer HDL2 being formed on the first aluminum oxide layer AOL1 in an amorphous state. In this case, the first high-k dielectric layer HDL1 has a dielectric constant greater than that of the second high-k dielectric layer HLD2. For example, even if both of the first and second high-k dielectric layers HDL1 and HDL2 are a $ZrO_2$ layer, the first high-k dielectric layer HDL1 has a higher dielectric constant than the second high-k dielectric layer HDL2.

According to embodiments, the first aluminum oxide layer AOL1 is provided between the first and second high-k dielectric layers HDL1 and HDL2. The second aluminum oxide layer AOL2 and the silicon oxide layer SOL are provided on the second high-k dielectric layer HDL2. In some embodiments, as shown in FIG. 7, the second aluminum oxide layer AOL2 is interposed between the second high-k dielectric layer HDL2 and the silicon oxide layer SOL. In other embodiments, as shown in FIG. 8, the silicon oxide layer SOL is interposed between the second high-k dielectric layer HDL2 and the second aluminum oxide layer AOL2.

According to embodiments, the first and second aluminum oxide layers AOL1 and AOL2 include $Al_2O_3$, and the silicon oxide layer SOL includes $SiO_2$. Each of the silicon oxide layer SOL and the first and second aluminum oxide layers AOL1 and AOL2 have a band gap greater than those of the first and second high-k dielectric layers HDL1 and HDL2, and thus it is possible to suppress a leakage current generated from the dielectric layer DL. In some embodiments, each of the thicknesses AOL_TH and AOL2_TH of the first and second aluminum oxide layers AOL1 and AOL2 are from about 0.005 to about 0.5 times the thickness HDL1_TH of the first high-k dielectric layer HDL1. For example, each of the thicknesses AOL1_TH and AOL2_TH of the first and second aluminum oxide layers AOL1 and AOL2 is in the range from about 0.3 Å to about 10 Å. In some embodiments, the thickness SOL_TH of the silicon oxide layer SOL is from about 0.003 to about 0.5 times the thickness HDL1_TH of the first high-k dielectric layer HDL. For example, the thickness SOL_TH of the silicon oxide layer SOL is in the range from about 0.2 Å to about 10 Å.

In some embodiments, the thickness SOL_TH of the silicon oxide layer SOL is less than the thicknesses AOL1_TH and AOL2_TH of the first and second aluminum oxide layers AOL1 and AOL2. However, embodiments of the present inventive concept are not limited thereto. The silicon oxide layer SOL and the first and second aluminum oxide layers AOL1 and AOL2 may be formed using, for example, atomic layer deposition (ALD) and have an amorphous state. In some embodiments, different from those shown in FIGS. 7 and 8, the first aluminum oxide layer AOL1, the second aluminum oxide layer AOL2, or the silicon oxide layer SOL partially cover respective underlying layers.

As described with reference to FIGS. 4A and 4B, according to exemplary embodiments of the present inventive concept, the leakage current of a capacitor can be reduced without increasing the equivalent oxide thickness by introducing a silicon oxide layer into a dielectric layer that includes a high-k dielectric layer and an aluminum oxide layer.

Figure 9A:
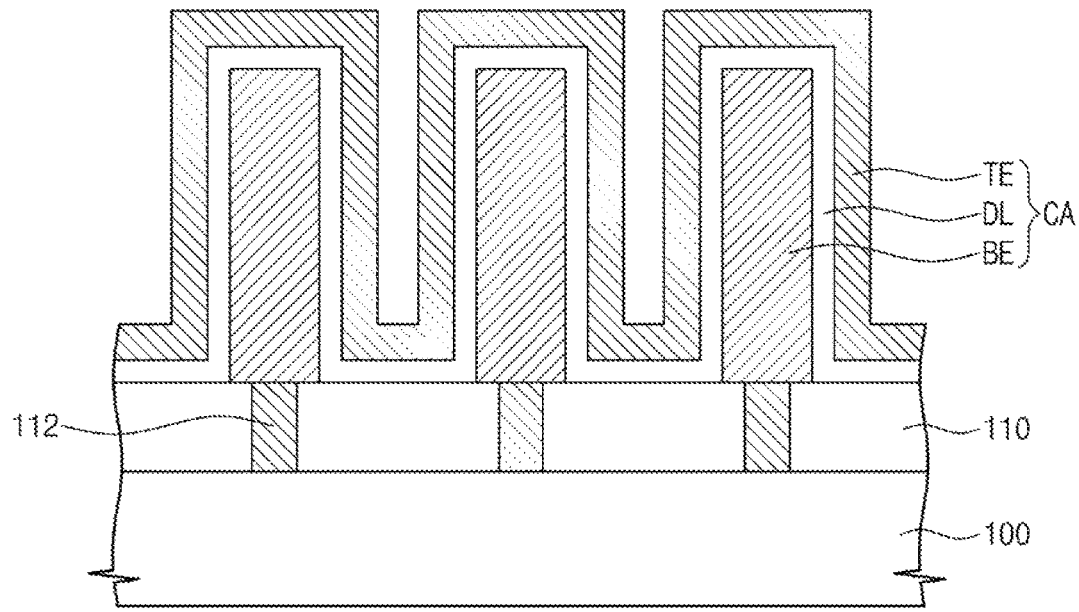
FIGS. 9A to 9C are cross-sectional views of a shape of a bottom electrode that constitutes a capacitor of a semiconductor device according to exemplary embodiments of the present inventive concept.
Figure 9B:
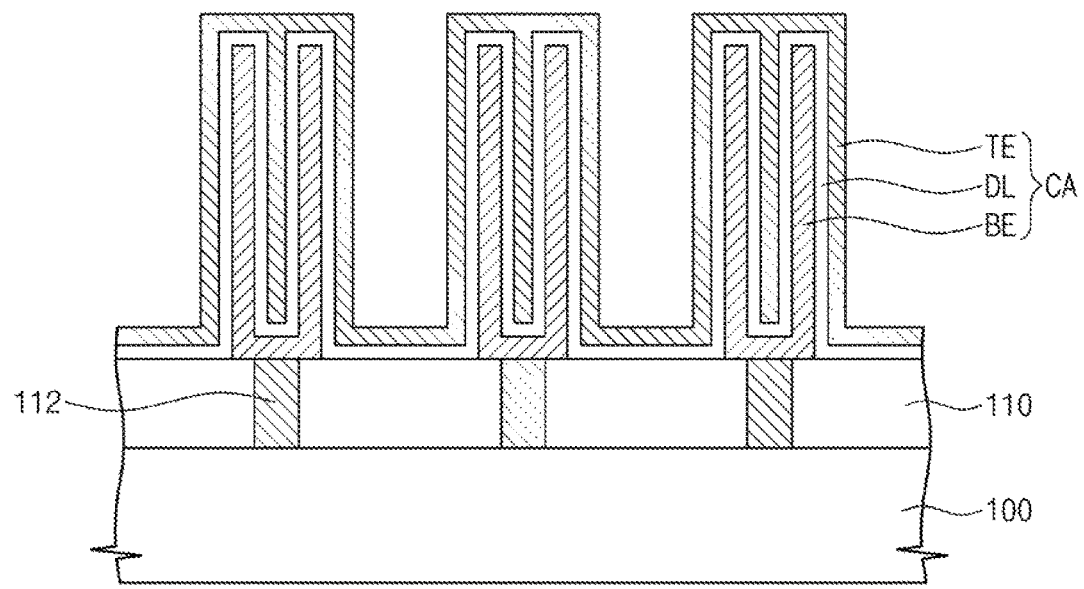
Figure 9C:
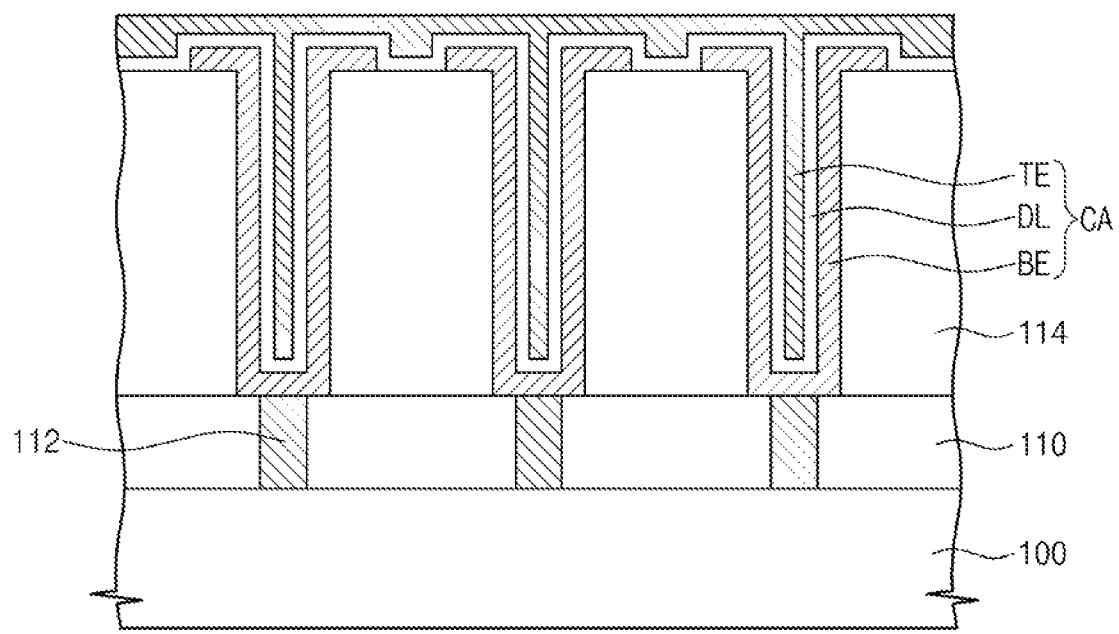

FIGS. 9A to 9C are cross-sectional views of a shape of bottom electrode that constitutes a capacitor of a semiconductor device according to exemplary embodiments of the present inventive concept.

Referring to FIGS. 9A to 9C, according to embodiments, an interlayer dielectric layer 110 is provided on a substrate 100. The interlayer dielectric layer 110 includes therethrough a contact plug 112 that is electrically connected to the substrate 100.

According to embodiments, the interlayer dielectric layer 110 includes thereon capacitors CA electrically connected to the substrate 100. Each of the capacitors CA is provided on the interlayer dielectric layer 110 and includes a bottom electrode BE connected to a corresponding contact plug 112. The bottom electrode BE is electrically connected to the substrate 100 through the contact plug 112.

For example, as shown in FIG. 9A, each of the bottom electrodes BE has a pillar shape. Alternatively, as shown in FIG. 9B, each of the bottom electrodes BE has a hollow cylindrical shape with a closed bottom end.

According to embodiments, each of the capacitors CA further includes a top electrode TE that is provided on the interlayer dielectric layer 110 while covering the bottom electrode BE and a dielectric layer DL interposed between the bottom electrode BE and the top electrode TE. The top electrode TE is a common electrode that covers a plurality of the bottom electrodes BE respectively included in the capacitors CA. If each of the bottom electrodes BE has a hollow cylindrical shape as shown FIG. 9B, the top electrode TE covers an inner sidewall of each of the bottom electrodes BE. The dielectric layer DL conformally covers a top surface and sidewalls of each of the bottom electrodes BE and extends between the top electrode TE and the interlayer dielectric layer 110.

Alternatively, in other embodiments as shown in FIG. 9C, each of the bottom electrodes BE is provided in an upper insulation layer 114 on the interlayer dielectric layer 110. Each of the bottom electrodes BE has a hollow cylindrical shape with a closed bottom end, and sidewalls of the bottom electrodes BE are in contact with the upper insulation layer 114. In some embodiments, each of the bottom electrodes BE includes an extension that extends onto the upper insulation layer 114.

According to embodiments, the top electrode TE is provided on the upper insulation layer 114 and covers an inner sidewall of each of the bottom electrodes BE. The dielectric layer DL is provided between the bottom electrodes BE and the top electrode TE. The dielectric layer DL conformally covers a top surface and sidewalls of each of the bottom electrodes BE and extends between the top electrode TE and the interlayer dielectric layer 114.

According to embodiments, the dielectric layer DL is substantially the same as the dielectric layer DL described with reference to one of FIGS. 2, 3, 5, 6, 7 and 8.

According to exemplary embodiments of the present inventive concept, the leakage current of a capacitor can be reduced without increasing the equivalent oxide thickness by introducing a silicon oxide layer into a dielectric layer that includes a high-k dielectric layer and an aluminum oxide layer.

Although embodiments of the present invention have been described in connection with exemplary embodiments of the present inventive concept illustrated in the accompanying drawings, embodiments are not limited thereto. It will be apparent to those skilled in the art that various substitutions, modifications, and changes may be thereto without departing from the scope and spirit of embodiments of the inventive concept.

What is claimed is:

1. A semiconductor device, comprising:
   a capacitor that includes a first electrode, a second electrode, and a dielectric layer between the first electrode and the second electrode,
   wherein the dielectric layer comprises:
      a first high-k dielectric layer between the first electrode and the second electrode;
      a first silicon oxide layer between the first high-k dielectric layer and the second electrode; and
      a first aluminum oxide layer between the first high-k dielectric layer and the second electrode,
      wherein the first high-k dielectric is crystalline, and the first silicon oxide layer and the first aluminum oxide layer are both amorphous.

2. The semiconductor device of claim 1, wherein the first high-k dielectric layer has a thickness greater than a thickness of each of the first silicon oxide layer and the first aluminum oxide layer.

3. The semiconductor device of claim 1, Wherein the first silicon oxide layer has a thickness less than a thickness of the first aluminum oxide layer.

4. The semiconductor device of claim 1, wherein the first high-k dielectric layer is disposed directly on the first electrode.

5. The semiconductor device of claim 1,
   wherein the dielectric layer further comprises:
      a second high-k dielectric layer between the first high-k dielectric layer and the first silicon oxide and first aluminum oxide layers;
      wherein the second high-k dielectric layer has a thickness less than a thickness of the first high-k dielectric layer.

6. The semiconductor device of claim 5, wherein the dielectric layer further comprises a second silicon oxide layer between the second high-k dielectric layer and the first high-k dielectric layer,
   wherein the second high-k dielectric layer has a thickness greater than a thickness of the first silicon oxide layer, a thickness of the second silicon oxide layer, and a thickness of the first aluminum oxide layer.

7. The semiconductor device of claim 5,
   wherein the dielectric layer further comprises a second aluminum oxide layer between the second high-k dielectric layer and the first high-k dielectric layer,
   wherein the second high-k dielectric layer has a thickness greater than a thickness of the first silicon oxide layer, a thickness of the first aluminum oxide layer, and a thickness of the second aluminum oxide layer.

8. A semiconductor device, comprising:
a capacitor that includes a first electrode, a dielectric layer, and a second electrode that are sequentially stacked on a substrate,
wherein the dielectric layer comprises:
   a first high-k dielectric layer on the first electrode;
   a second high-k dielectric layer on the first high-k dielectric layer;
   a first leakage prevention oxide layer between the first high-k dielectric layer and the second high-k dielectric layer; and
   a second leakage prevention oxide layer and a third leakage prevention oxide layer that are sequentially stacked on the second high-k dielectric layer,
wherein the first leakage prevention oxide layer is a silicon oxide layer or an aluminum oxide layer, and
wherein one of the second and third leakage prevention oxide layers is a silicon oxide layer and the other of the second and third leakage prevention oxide layers is an aluminum oxide layer.

9. The semiconductor device of claim 8, wherein the first high-k dielectric layer has a thickness greater than a thickness of the second high-k dielectric layer.

10. The semiconductor device of claim 8, wherein
the first and second high-k dielectric layers are a zirconium oxide layer, and
the first high-k dielectric layer has a dielectric constant greater than a dielectric constant of the second high-k dielectric layer.

11. The semiconductor device of claim 8, wherein
the first high-k dielectric layer is thicker than each of the first, second, and third leakage prevention oxide layers, and
the second high-k dielectric layer is thicker than each of the first, second, and third leakage prevention oxide layers.

12. A semiconductor device, comprising:
an interlayer dielectric layer on a substrate;
a plurality of contact plugs that penetrate through the interlayer dielectric layer; and
a plurality of capacitors on the interlayer dielectric layer, each including a bottom electrode electrically connected to a corresponding one of the contact plugs, and a dielectric layer that covers the bottom electrode and that includes a first high-k dielectric layer on the bottom electrode, and a pair of leakage prevention oxide layers that are sequentially stacked on the first high-k dielectric layer,
wherein one of the pair of leakage prevention oxide layers is a silicon oxide layer and the other of the pair of leakage prevention oxide layers is an aluminum oxide layer.

13. The semiconductor device of claim 12, wherein the dielectric layer further comprises:
a second high-k dielectric layer between the first high-k dielectric layer and the pair of leakage prevention oxide layers;
wherein the first and second high-k dielectric layers are a zirconium oxide layer, and
the first high-k dielectric layer has a dielectric constant greater than a dielectric constant of the second high-k dielectric layer.

14. The semiconductor device of claim 13, wherein the dielectric layer further comprises a third leakage prevention oxide layer between the second high-k dielectric layer and the first high-k dielectric layer,
wherein the third leakage prevention oxide layer is a silicon oxide layer or an aluminum oxide layer, and
wherein the second high-k dielectric layer has a thickness greater than a thickness of the each of the pair of leakage prevention oxide layers and a thickness of the third leakage prevention oxide layer.

15. The semiconductor device of claim 12, wherein the plurality of capacitors further comprises a top electrode that covers the plurality of bottom electrodes with the dielectric layer interposed therebetween.

16. The semiconductor device of claim 15, wherein each of the bottom electrodes has a pillar shape, and the top electrode and dielectric layer conformally cover a top surface and sidewalls of each of the bottom electrodes.

17. The semiconductor device of claim 15, wherein each of the bottom electrodes has a hollow cylindrical shape with a closed bottom end, and the top electrode and dielectric layer conformally cover a top surface and inner and outer sidewalls of each of the bottom electrodes.

18. The semiconductor device of claim 15, wherein each of the bottom electrodes is disposed in an insulation layer on the interlayer dielectric layer, each of the bottom electrodes has a hollow cylindrical shape with a closed bottom end, and sidewalls of the bottom electrodes are in contact with the insulation layer, and the top electrode is provided on the insulation layer and covers an inner sidewall of each of the bottom electrodes.

19. The semiconductor device of claim 18, wherein each of the bottom electrodes includes an extension that extends onto an upper insulation layer.

* * * * *